United States Patent
Hirose et al.

(10) Patent No.: US 12,495,492 B2
(45) Date of Patent: Dec. 9, 2025

(54) GLASS FABRIC, PREPREG, AND PRINTED CIRCUIT BOARD

(71) Applicant: ASAHI KASEI KABUSHIKI KAISHA, Tokyo (JP)

(72) Inventors: Amane Hirose, Tokyo (JP); Hiroyuki Honma, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 209 days.

(21) Appl. No.: 18/278,292

(22) PCT Filed: Oct. 11, 2021

(86) PCT No.: PCT/JP2021/037618
§ 371 (c)(1),
(2) Date: Aug. 22, 2023

(87) PCT Pub. No.: WO2022/215287
PCT Pub. Date: Oct. 13, 2022

(65) Prior Publication Data
US 2024/0121894 A1    Apr. 11, 2024

(30) Foreign Application Priority Data
Apr. 9, 2021    (JP) .................. 2021-066642

(51) Int. Cl.
| | |
|---|---|
| *H05K 1/03* | (2006.01) |
| *C03C 3/06* | (2006.01) |
| *C03C 13/00* | (2006.01) |
| *C08J 5/24* | (2006.01) |
| *D03D 1/00* | (2006.01) |
| *D03D 15/267* | (2021.01) |
| *D06M 13/513* | (2006.01) |
| *D06M 101/00* | (2006.01) |

(52) U.S. Cl.
CPC ............ *H05K 1/0366* (2013.01); *C03C 3/06* (2013.01); *C03C 13/00* (2013.01); *C08J 5/244* (2021.05); *D03D 1/0082* (2013.01); *D03D 15/267* (2021.01); *D06M 13/513* (2013.01); *C03C 2201/02* (2013.01); *C03C 2213/00* (2013.01); *D06M 2101/00* (2013.01); *D06M 2200/12* (2013.01); *D10B 2505/02* (2013.01); *H05K 2201/029* (2013.01)

(58) Field of Classification Search
CPC .......... D06M 13/513; D06M 2101/00; D06M 2200/12; H05K 1/03; H05K 1/0366; H05K 2201/029; D03D 15/267; D03D 1/0082; D03D 13/004; D03D 13/008; C08J 5/244; C08J 5/08; C03C 13/00; C03C 25/40; C03C 2201/02; C03C 2213/00; D10B 2101/06; D10B 2505/02
USPC ........................................................ 442/71
See application file for complete search history.

(56) References Cited

U.S. PATENT DOCUMENTS

| | | |
|---|---|---|
| 4,370,376 A | 1/1983 | Gangal et al. |
| 2005/0064159 A1 | 3/2005 | Amou et al. |
| 2008/0261472 A1 | 10/2008 | Amou et al. |
| 2009/0266591 A1 | 10/2009 | Amou et al. |
| 2012/0095149 A1 | 4/2012 | Sawanoi et al. |
| 2018/0094110 A1 | 4/2018 | Nakanishi et al. |
| 2019/0136000 A1 | 5/2019 | Kakizaki et al. |
| 2019/0225762 A1 | 7/2019 | Tsutsumi et al. |
| 2020/0071858 A1 | 3/2020 | Ikejiri et al. |
| 2020/0216351 A1* | 7/2020 | Hausrath .............. H05K 1/0306 |
| 2020/0247972 A1 | 8/2020 | Sato et al. |
| 2020/0270411 A1 | 8/2020 | Kitai et al. |
| 2020/0389973 A1* | 12/2020 | Uchida ................... B32B 15/14 |
| 2022/0106453 A1 | 4/2022 | Miyagi et al. |
| 2022/0324751 A1 | 10/2022 | Nakamura et al. |

FOREIGN PATENT DOCUMENTS

| | | |
|---|---|---|
| CN | 110054870 A | 7/2019 |
| CN | 111819227 A | 10/2020 |
| CN | 118207673 A | 6/2024 |
| JP | 56-166269 A | 12/1981 |
| JP | 2003-160350 A | 6/2003 |
| JP | 2004-107112 A | 4/2004 |
| JP | 2005-50885 A | 2/2005 |
| JP | 2005-89691 A | 4/2005 |
| JP | 2005-281889 A | 10/2005 |
| JP | 2005-336694 A | 12/2005 |
| JP | 2009-286686 A | 12/2009 |
| JP | 2012-97165 A | 5/2012 |
| JP | 2020-2520 A | 1/2020 |
| JP | 2020-100913 A | 7/2020 |
| JP | 2020-194888 A | 12/2020 |
| KR | 10-0975161 B1 | 8/2010 |
| KR | 10-1129010 B1 | 4/2012 |
| WO | WO 2019/065940 A1 | 4/2019 |
| WO | WO 2019/065941 A1 | 4/2019 |
| WO | WO 2019/163159 A1 | 8/2019 |
| WO | WO 2020/194772 A1 | 10/2020 |
| WO | WO 2020/255396 A1 | 12/2020 |

OTHER PUBLICATIONS

International Preliminary Report on Patentability and Written Opinion of the International Searching Authority for International Application No. PCT/JP2021/037618, dated Oct. 10, 2023, with an English translation.
International Search Report for International Application No. PCT/JP2021/037618, dated Dec. 7, 2021, with an English translation.

* cited by examiner
(Continued)

Primary Examiner — Camie S Thompson
(74) Attorney, Agent, or Firm — Birch, Stewart, Kolasch & Birch, LLP

(57) ABSTRACT

Provided is a glass fabric formed by weaving warp and weft glass yarns comprising a plurality of glass filaments, wherein the surface of the glass fabric is subjected to surface treatment with a surface treatment agent, and the difference between the dielectric loss tangent and the bulk dielectric loss tangent of the glass fabric as measured by using a split cylinder resonator is greater than 0 and not more than $1.0 \times 10^{-3}$ at 10 GHz.

19 Claims, No Drawings

GLASS FABRIC, PREPREG, AND PRINTED CIRCUIT BOARD

FIELD

The present invention relates to a glass fabric, a prepreg, and a printed circuit board.

BACKGROUND

Currently, the performance of information terminals such as smartphones and high-speed communication represented by 5G communication are progressing. In accordance therewith, in printed circuit boards for high-speed communication, the dielectric constant and dissipation factor of insulating materials used to reduce transmission loss have been significantly reduced, and insulation reliability is required at a higher level than before.

Examples of insulating materials for printed circuit boards for high-speed communication are reported in Patent Literature 1 and 2. Specifically, a laminate in which prepregs obtained by impregnating glass fabrics with a low dielectric thermosetting resin which is crosslinked and cured by a radical reaction, such as a polyphenylene ether terminal-modified with a vinyl or methacryloxy group (hereinafter referred to generically as a "matrix resin"), and drying are laminated and cured under heat and pressure is known (Patent Literature 1 and 2). According to Patent Literature 1 and 2, by combining with a glass fabric having a low dielectric constant and a low dissipation factor, a low dielectric and a low dissipation factor as a laminated board can be realized.

In order to improve reactivity with low dielectric resins which are cured by a radical reaction, as a surface treatment agent for the surface of a glass fabric, a silane coupling agent having relatively high hydrophobicity and having a functional group which participates in a radical reaction such as a methacrylic group is used. When such a silane coupling agent is used for surface treatment, there is a problem of degraded insulation reliability due to peeling at the glass fabric/resin interface. As a solution to this problem, there is disclosed a technique wherein a surfactant is not present on the surface of the glass fabric (Patent Literature 3).

CITATION LIST

Patent Literature

[PTL 1] WO 2019/065940
[PTL 2] WO 2019/065941
[PTL 3] WO 2020/194772

SUMMARY

Technical Problem

However, in Patent Literature 3, even if it is assumed that peeling of the glass fabric/resin interface during drilling can be suppressed, there is no mention of deterioration in insulation reliability due to peeling of the interface caused by increased heat generation due to densification of substrate wiring, high-speed communication, etc., and there is room for improvement. Thus, an object of the present invention is to provide a glass fabric exhibiting excellent heat resistance, as well as a prepreg and printed circuit board using the same.

Solution to Problem

As a result of rigorous investigation, the present inventors have focused their attention on organic matter physically adhering to the glass fabric. Specifically, the present inventors have discovered that the heat resistance of a laminate can be significantly improved by reducing, to a certain amount or less, modification products of the sizing agent which could not be completely reduced by heat cleaning and modification products of the silane coupling agent which could not form chemical bonds with the glass surface. Additionally, the present inventors have discovered that modification products of the sizing agent cannot be sufficiently reduced under known conditions, and that the silane coupling agent which has failed to form chemical bonds with the glass surface cannot be sufficiently reduced by the known method of washing with water due to the strong hydrophobicity thereof. Further, the present inventors have discovered that the residual of adhering organic matter can be compared by specifying the difference between the dissipation factor of glass fabric and the bulk dissipation factor, and the present invention was achieved by combining the above findings. Some of the aspects of the present invention are exemplified below.

[1]

A glass fabric comprising glass yarns composed of a plurality of glass filaments and woven as warp and weft yarns, wherein the glass fabric is surface-treated on a surface thereof with a surface treatment agent, and a difference between a dissipation factor of the glass fabric and a bulk dissipation factor as measured using a split cylinder resonator is greater than 0 and $1.0 \times 10^{-3}$ or less at 10 GHz.

[2]

The glass fabric according to Item 1, wherein the difference between the dissipation factor of the glass fabric and the bulk dissipation factor is $8.0 \times 10^{-4}$ or less at 10 GHz.

[3]

The glass fabric according to Item 2, wherein the difference between the dissipation factor of the glass fabric and the bulk dissipation factor is $6.0 \times 10^{-4}$ or less at 10 GHz.

[4]

The glass fabric according to Item 3, wherein the difference between the dissipation factor of the glass fabric and the bulk dissipation factor is $4.0 \times 10^{-4}$ or less at 10 GHz.

[5]

The glass fabric according to Item 4, wherein the difference between the dissipation factor of the glass fabric and the bulk dissipation factor is $2.0 \times 10^{-4}$ or less at 10 GHz.

[6]

The glass fabric according to any one of Items 1 to 5, wherein the glass yarns constituting the glass fabric contain 95 wt % to 100 wt % of silicon (Si) in terms of silicon dioxide ($SiO_2$).

[7]

The glass fabric according to any one of Items 1 to 6, wherein the glass yarns constituting the glass fabric contain 99.0 wt % to 100 wt % of Si in terms of $SiO_2$.

[8]

The glass fabric according to any one of Items 1 to 7, wherein the glass yarns constituting the glass fabric contain 99.9 wt % to 100 wt % of Si in terms of $SiO_2$.

[9]

The glass fabric according to any one of Items 1 to 8, wherein the bulk dissipation factor of glass constituting the glass yarns is greater than 0 and $2.5 \times 10^{-3}$ or less at 10 GHz.

[10]

The glass fabric according to any one of Items 1 to 9, wherein the surface treatment agent comprises a silane coupling agent represented by the following formula (1):

$$X(R)_{3-n}SiY_n \qquad (1)$$

where X is an organic functional group having at least one of a radical-reactive unsaturated double bond group and an amino group; each Y is independently an alkoxy group; n is an integer of 1 to 3; and each R is independently a group selected from the group consisting of a methyl group, an ethyl group, and a phenyl group.

[11]

The glass fabric according to Item 10, where X in formula (1) is an organic functional group that does not form a salt with an ionic compound.

[12]

The glass fabric according to Item 10 or 11, wherein X in formula (1) does not contain an amine or an ammonium cation.

[13]

The glass fabric according to any one of Items 10 to 12, wherein X in formula (1) is an organic functional group having one or more methacryloxy groups or acryloxy groups.

[14]

The glass fabric according to Item 9, wherein the bulk dissipation factor of the glass constituting the glass yarns is $2.0 \times 10^{-3}$ or less at 10 GHz.

[15]

The glass fabric according to Item 14, wherein the bulk dissipation factor of the glass constituting the glass yarns is $1.7 \times 10^{-3}$ or less at 10 GHz.

[16]

The glass fabric according to Item 15, wherein the bulk dissipation factor of the glass constituting the glass yarns is $1.5 \times 10^{-3}$ or less at 10 GHz.

[17]

The glass fabric according to Item 16, wherein the bulk dissipation factor of the glass constituting the glass yarns is $1.2 \times 10^{-3}$ or less at 10 GHz.

[18]

The glass fabric according to Item 17, wherein the bulk dissipation factor of the glass constituting the glass yarns is $1.0 \times 10^{-3}$ or less at 10 GHz.

[19]

The glass fabric according to any one of Items 1 to 18, wherein the glass fabric has a total carbon content of 0.02% to 0.5%.

[20]

The glass fabric according to any one of Items 1 to 19, wherein the glass fabric has a total carbon content of 0.02% to 0.1%.

[21]

The glass fabric according to any one of Items 1 to 20, which is for a printed circuit board substrate.

[22]

A prepreg, comprising the glass fabric according to any one of Items 1 to 21, a thermosetting resin, and an inorganic filler.

[23]

A printed circuit board, comprising the prepreg according to Item 22.

Advantageous Effects of Invention

According to the present invention, there can be provided a glass fabric exhibiting excellent heat resistance, as well as a prepreg and printed circuit board using the same.

DESCRIPTION OF EMBODIMENTS

An embodiment (hereinafter referred to as "present embodiment") of the present invention will be described in detail below, but the present invention is not limited thereto, and various changes can be made within a scope which does not deviate from the spirit thereof.

In the present embodiment, numerical ranges described using "to" include the numerical values before and after "to" within the numerical range. Further, in the present embodiment, in numerical ranges described in stages, the upper limit or lower limit described in a certain numerical range may be replaced with the upper limit or lower limit of another numerical range described in stages. Further, in the present embodiment, the upper limit value or lower limit value described in a certain numerical range can be replaced with the values shown in the Examples. In the present embodiment, the term "step" includes not only independent steps but also steps which cannot be clearly distinguished from other steps, as long as the purpose of the step is achieved.

[Glass Fabric]

The glass fabric of the present embodiment is a glass fabric comprising glass yarns composed of a plurality of glass filaments and woven as warp and weft yarns. The glass fabric according to the present embodiment is surface-treated with a surface treatment agent, and the difference between the dissipation factor of the glass fabric and the bulk dissipation factor as measured using a split cylinder resonator is greater than 0 and $1.0 \times 10^{-3}$ or less (e.g., $1.00 \times 10^{-3}$ or less) at 10 GHz. The glass fabric according to the present embodiment is preferably used as a printed circuit board substrate. The surface treatment agent, as described later, is used for treating the surfaces of the glass yarns (including the glass filaments).

[Difference Between Dissipation Factor of Glass Fabric and Bulk Dissipation Factor]

The configuration of the glass fabric according to the present embodiment that exhibits the above-described effects is specified by a relationship which satisfies the following formula:

$$|\text{Dissipation factor of glass fabric-bulk dissipation factor}|@10\ \text{GHz} \leq 1.0 \times 10^{-3}$$

The dissipation factor of the glass fabric at 10 GHz and the bulk dissipation factor at 10 GHz can be measured using a split cylinder resonator, which will be described later, and the specific measurement method and measurement conditions are shown in the Examples.

From the viewpoint of further improving the effects of the present invention, the dissipation factor of the glass fabric and the bulk dissipation factor have a relationship which satisfies the following: dissipation factor of glass fabric-bulk dissipation factor @ 10 GHz≤$1.0 \times 10^{-3}$. It is preferable that the relationship satisfy 0≤dissipation factor of glass fabric-bulk dissipation factor @ 10 GHz≤$0.8 \times 10^{-3}$, it is more preferable that the relationship satisfy 0 dissipation factor of glass fabric-bulk dissipation factor @ 10 GHz≤$0.6 \times 10^{-3}$, it is further preferable that the relationship satisfy 0 s dissipation factor of glass fabric-bulk dissipation factor @ 10 GHz≤$0.4 \times 10^{-3}$, and it is particularly preferable that the relationship satisfy 0≤dissipation factor of glass fabric-bulk dissipation factor @ 10 GHz≤$0.2 \times 10^{-3}$

[Method for Measuring Dissipation Factor of Glass Fabric]

The dielectric property evaluation method of present embodiment includes a step of measuring the dielectric properties of the glass fabric (hereinafter referred to also simply as "fabric") using a split cylinder resonator. The measurement method in the measurement step described above is not limited to a specific method as long as it is a measurement method using a split cylinder resonator.

According to this measuring method, measurement can be performed more simply and accurately as compared to a conventional measurement method in which a substrate as a measurement sample is produced and the dielectric properties are evaluated. The reason why the dielectric properties of the fabric can be easily and accurately measured by using the resonance method is that, though not to be bound by theory, the resonance method is suitable for evaluating low-loss materials in the high-frequency range. In addition to the resonance method, the lumped parameter method and the reflection transmission method are known as dielectric property evaluation methods. In the lumped parameter method, it is necessary to form a capacitor by interposing the measurement sample between two electrodes, and as a result, there is a problem in that the operation is very complicated. Furthermore, the reflection transmission method has a problem in that it is difficult to evaluate the dissipation factor of the sample with high accuracy when evaluating low-loss materials because of the strong influence of port matching characteristics. For the above reasons, the resonance method is preferable as a method for evaluating the dielectric properties of the fabric.

In the present measurement step, examples of preferable measurement instruments using the resonance method include a split cylinder resonator.

In order to measure the dielectric properties of the fabric used for printed circuit boards for high-speed communication, regarding the measurable range of the measuring instrument, for the dielectric constant (Dk) and the dissipation factor (Df), $Dk=1.1$ $Fm^{-1}$ to $50$ $Fm^{-1}$ and $Df=1.0\times10^{-6}$ to $1.0\times10^{-1}$ are preferable, $Dk=1.5$ $Fm^{-1}$ to $10$ $Fm^{-1}$ and $Df=1.0\times10^{-5}$ to $5.0\times10^{-1}$ are more preferable, and $Dk=2.0$ $Fm^{-1}$ to $5$ $Fm^{-1}$ and $Df=5.0\times10^{-5}$ to $1.0\times10^{-2}$ are further preferable.

It is preferable that the measurable frequency of the measuring equipment be 10 GHz or higher. When the frequency is 10 GHz or more, the characteristics can be evaluated in what is assumed to be the frequency band region when the glass fabric is actually used for printed circuit board substrates for high-speed communication.

In order to measure the dielectric properties of the fabric in a larger area to determine whether the measurement results are within the preset reference value range, the area measured by the measuring method is preferably 10 mm² or more. The area measured by the measuring method is more preferably 15 mm² or more, and further preferably 20 mm² or more.

The measurable thickness of the sample is not particularly limited, and is preferably 3 μm to 300 μm, more preferably 5 μm to 200 μm, and further preferably 7 μm to 150 μm.

[Bulk Dissipation Factor]

As used herein, bulk dissipation factor means the dissipation factor measured at 10 GHz using a split cylinder resonator on the raw materials of the glass fabric. The raw materials of the glass fabric may be, for example, a glass raw material such as the glass species, glass filaments, or glass yarns, as will be described later. The bulk dissipation factor of the glass raw material constituting the glass fabric can be measured by measuring a glass plate having a thickness of 300 μm or less and having the same type and composition as the glass raw material by the same method as the dissipation factor of glass fabric.

From the viewpoint of further improving the effect of the present invention, in the weaving of the glass fabric according to the present embodiment, the bulk dissipation factor of the glass constituting the glass yarns, when measured using a split cylinder resonator, is, at 10 GHz, preferably $2.5\times10^{-3}$ or less, more preferably $2.0\times10^{-3}$ or less, further preferably $1.7\times10^{-3}$ or less, even further preferably $1.5\times10^{-3}$ or less, particularly preferably $1.2\times10^{-3}$ or less, and most preferably $1.0\times10^{-3}$ or less.

Though not to be bound by theory, it is considered that the dissipation factor of the glass fabric, bulk dissipation factor, and difference therebetween can be adjusted within the numerical range described above by:
- selecting a surface treatment agent to suppress the residual and occurrence of (i) or (ii) below;
- in the glass fabric production step, optimizing conditions in, for example, the heat de-oiling (heat de-sizing) step, residual size reduction step, fixing step, washing step, drying step, finishing washing step, and finishing drying step; and
- in the finishing washing step, washing the surface-treated glass fabric with an organic solvent.
- (i) the occurrence of thermal oxidation degradation products of the sizing agent physically adhering to the glass yarn surface; and
- (ii) residues or modification products of the surface treatment agent which physically adhere to the glass surface without forming chemical bonds and which cannot be reduced by washing with water.

[Average Filament Diameter]

The average filament diameter of the glass filaments is preferably 2.5 to 9.0 μm, more preferably 2.5 to 7.5 μm, further preferably 3.5 to 7.0 μm, even further preferably 3.5 to 6.0 μm, and particularly preferably 3.5 to 5.0 μm.

[Thread Count]

The warp and weft yarns constituting the glass fabric preferably have a thread count of 10 to 120 yarns/inch (=10 to 120 yarns/25.4 mm), more preferably 40 to 100 yarns/inch, and further preferably 40 to 100 yarns/inch.

[Fabric Weight]

The fabric weight (basis weight) of the glass fabric is preferably 8 to 250 g/m², more preferably 8 to 100 g/m², further preferably 8 to 80 g/m², and particularly preferably 8 to 50 g/m².

[Weave Structure]

The weave structure of the glass fabric is not particularly limited, and examples thereof include weave structures such as plain weave, Nanako weave, satin weave, and twill weave. Among these, the plain weave structure is more preferable.

[Glass Type]

Glass fabrics used for laminates are conventionally composed of a glass called E-glass (non-alkali glass). Conversely, in the glass fabric of the present embodiment, for example, L-glass, NE-glass, D-glass, L2-glass, T-glass, silica glass, or quartz glass may be used. From the viewpoint of dielectric properties. L-glass, L2-glass, silica glass, and quartz glass are more preferably used, and among these, silica glass and quartz glass are particularly preferable. Furthermore, from the viewpoint of improving the dimensional stability of a laminated substrate containing the glass fabric, S-glass, T-glass, silica glass, and quartz glass are more preferably used, and among these, silica glass and quartz glass are particularly preferable.

The Si content of the glass filament constituting the silica glass or quartz glass fabric, in terms of silicon dioxide ($SiO_2$), is preferably in the range of 95 wt % to 100 wt %, more preferably in the range of 99.0 wt % to 100 wt %, further preferably in the range of 99.5 wt % to 100 wt %, and particularly preferably in the range of 99.9 wt % to 100 wt %. If the Si content is less than 95%, the dielectric properties or the dimensional stability of the laminated substrate will be poor.

Furthermore, the composition of each glass and the bulk dissipation factor exhibit the following relationships:
- glass of 99 wt % or more in terms of $SiO_2$: bulk dissipation factor$\leq 1.2 \times 10^{-3}$
- glass of 50% or more in terms of $SiO_2$, 20% or more in terms of boron dioxide ($B_2O_3$), and 3% or more in terms of diphosphorus pentoxide ($P_2O_5$): bulk dissipation factor$\leq 1.7 \times 10^{-3}$.
- glass of 50% or more in terms of $SiO_2$, 20% or more in terms of $B_2O_3$, 0.4% or more in terms of strontium oxide (SrO): bulk dissipation factor$\leq 1.7 \times 10^{-3}$

[Glass Yarns and Silane Coupling Agent]

The glass yarns (including the glass filaments) constituting the glass fabric are preferably surface-treated with a silane coupling agent. It is preferable that a silane coupling agent represented by the following formula (1).

$$X(R)_{3-n}SiY_n \qquad (1)$$

where X is an organic functional group having at least one of a radical-reactive unsaturated double bond group and an amino group; each Y is independently an alkoxy group; n is an integer of 1 to 3; and R is a group selected from the group consisting of a methyl group, an ethyl group, and a phenyl group, be used as the silane coupling agent.

The present embodiment focuses on the fact that:
(i) very small amounts of thermal oxidation degradation products of the sizing agent which remain physically adhering to the glass yarn surface; and
(ii) residues or modification products of the surface treatment agent which physically adhere to the glass surface without forming chemical bonds and which cannot be reduced by washing with water are the reasons for the increase in the dissipation factor of conventional glass fabrics. From the viewpoint of suppressing the generation of the (i) thermal oxidation degradation products or (ii) residues or modification products described above, X in formula (1) is preferably an organic functional group which does not form a salt with an ionic compound. From the viewpoint of reactivity with the matrix resin, X in formula (1) is more preferably an organic functional group having one or more methacryloxy groups or acryloxy groups. From the viewpoint of facilitating expression of the effect of the present invention, X in formula (1) preferably does not contain an amine such as a primary amine, secondary amine, or tertiary amine, or an ammonium cation such as a quaternary ammonium cation.

Regarding Y in formula (1) above, as the alkoxy group, any form can be used, and an alkoxy group having 1 to 5 carbon atoms (1, 2, 3, 4 or 5 carbon atoms) is preferably for stabilizing the glass fabric.

As the surface treatment agent, the silane coupling agent represented by formula (1) may be used alone, or two or more silane coupling agents with different Xs in formula (1) may be used in combination. As the silane coupling agent represented by formula (1), for example, known simple substances such as vinyltrimethoxysilane, 3-methacryloxypropyltrimethoxysilane, acryloxypropyltrimethoxysilane, 3-acryloxypropyltrimethoxvsilane, 5-hexenyltrimethoxysilane, or mixtures thereof can be used.

The molecular weight of the silane coupling agent is preferably 100 to 600, more preferably 150 to 500, and further preferably 200 to 450. Among these, it is particularly preferable to use two or more silane coupling agents having different molecular weights. By treating the glass yarn surface with two or more types of silane coupling agent having different molecular weights, the density of the treatment agent on the glass surface tends to increase, further improving the reactivity with the matrix resin.

From the viewpoint of reduced inhibition of reactivity with the resin, the silane coupling agent is preferably nonionic. Among nonionic silane coupling agents, silane coupling agents having at least one group selected from the group consisting of vinyl groups, methacryloxy groups, and acryloxy groups are preferable, and among these, silane coupling agents having at least one methacryloxy group or acryloxy group are particularly preferable. The heat resistance or reliability of the printed circuit board can be enhanced by not inhibiting the reactivity with the resin.

In formula (1), X is an organic functional group having at least one of an unsaturated double bond group and an amino group. Thus, in addition to an aspect in which X has both an unsaturated double bond group and an amino group, an aspect in which X has an unsaturated double bond group but does not have an amino group and an aspect in which X does not have an unsaturated double bond group but has an amino group are included in the scope of formula (1).

[Glass Fabric Production Method]

The method for the production of a glass fabric of the present embodiment is not particularly limited, and may comprise, for example, the following steps:
- a heating de-sizing step in which the glass fabric is de-sized by heating the surface temperature of the glass fabric at an arbitrary temperature of 650° C. to 1000° C.;
- a coating step in which a silane coupling agent is caused to adhere to the surface of the glass filaments using a treatment solution having a concentration of 0.1 to 3.0 wt %; a fixing step in which the silane coupling agent is fixed to the surface of the glass filaments by heat drying;
- a washing step in which silane coupling agent which did not form chemical bonds with the surface of a glass filament is washed away with water;
- a drying step in which the glass fabric is heat-dried after washing; and
- a finishing washing step in which residues and modified products of the silane coupling agent which did not form chemical bonds with the surface of the glass filament and which could not be reduced with water, are reduced. The coating step, the fixing step, the washing step, and the finishing washing step may be performed on the glass yarns before the weaving step in which the glass yarns are woven to obtain the glass fabric, or may be performed on the glass fabric after the weaving step. The method for producing the glass fabric may further include, if necessary, a residual size reduction step to reduce the denatured sizing agent remaining in the heat de-sizing step, and an opening filament step to open the glass yarns of the glass fabric after the weaving step. When the washing step is performed after the weaving step, the washing step may be performed using a high-pressure water spray to serve as the opening filament step. The composition of the glass fabric conventionally does not change before and after opening.

It is believed that as a result of the above production method, the adhering organic matter which increases dissipation factor can be removed, whereby a silane coupling agent layer can be formed on the surface of each individual glass filament constituting the glass yarns.

Examples of the residual size reduction step include dry cleaning such as plasma irradiation and UV ozone; wet cleaning such as high-pressure water washing, organic solvent washing, nanobubble water washing, and ultrasonic water washing; and heat cleaning at a temperature higher than the heat de-sizing step, and a plurality of these may be combined. However, as the residual size reduction step, short-time heat cleaning in which the glass fabric is passed through a heating furnace at 800° C. or higher from roller to roller is preferable.

As the method for applying the treatment solution to the glass fabric in the coating step, (a) a method of accumulating the treatment solution in a bath and immersing and passing the glass fabric therethrough (hereinafter referred to as "immersion method") or (B) a method of applying the treatment solution directly to the glass fabric with a roll coater, die coater, gravure coater, etc., may be adopted. In the case of coating by the immersion method of (a) above, it is preferable to select the immersion time of the glass fabric in the treatment solution so as to be 0.5 seconds or more and 1 minute or less.

As the method of heat drying the solvent after applying the treatment solution to the glass fabric, known methods such as hot air and electromagnetic waves may be adopted.

The heat drying temperature is preferably 80° C. or higher, and more preferably 90° C. or higher, so that the reaction between the silane coupling agent and the glass is sufficiently carried out. The heat drying temperature is preferably 300° C. or lower, and more preferably 180° C. or lower, in order to prevent deterioration of the organic functional groups of the silane coupling agent.

The finishing washing step is not particularly limited as long as it is a method which can reduce residues and modified products of the silane coupling agent that have not formed chemical bonds with the surface of the glass filament, and which cannot be reduced with water, and examples thereof include washing with an organic solvent. By performing the finishing washing step, even if a raw material such as quartz glass is used, it becomes easy to adjust the difference between the dissipation factor and the bulk dissipation factor of the obtained glass fabric within the numerical range described above.

In order to reduce the residues and modified products of the silane coupling agent which cannot be reduced with water, as the finishing washing step, washing with a highly hydrophobic organic solvent or an organic solvent having a high affinity which the residues and modified products of the silane coupling agent having a hydroxyl group is preferable. As the washing method, a known method such as an immersion method or shower spraying can be used, and heating and cooling may be performed as necessary. In order to prevent matter dissolved from matter adhering to the glass fabric from readhering, it is preferable to reduce excess solvent from the glass fabric with a squeezing roller after washing and before final drying. The organic solvent to be used is not particularly limited, and examples of highly hydrophobic organic solvents include:

saturated chain aliphatic hydrocarbons such as n-pentane, i-pentane, n-hexane, i-hexane, n-heptane, i-heptane, n-octane, i-octane, 2,2,4-trimethylpentane (isooctane), n-nonane, i-nonane, n-decane, i-decane, and 2,2,4,6,6-pentamethylheptane (isododecane);

saturated cycloaliphatic hydrocarbons such as cyclopentane, cyclohexane, methylcyclohexane, dimethylcyclohexane, ethylcyclohexane;

aromatic hydrocarbons such as benzene, toluene, xylene, ethylbenzene, diethylbenzene, trimethylbenzene, triethylbenzene;

halogen-containing solvents such as chloroform, dichloromethane, dichloroethane. Examples of organic solvents having a high affinity with modified silane coupling agents include:

alcohols such as methanol, ethanol and butanol;

ketones such as acetone and methyl ethyl ketone;

ethers such as methyl ethyl ether and diethyl ether;

amides such as N,N-dimethylformamide and N,N-dimethylacetamide; and dimethyl sulfoxide. Among these, from the viewpoint of adjusting the difference between the dissipation factor and the bulk dissipation factor of the obtained glass fabric within the numerical range described above, aromatic hydrocarbons, alcohols, and ketones are preferable, and methanol is more preferable.

The method for the production of a glass fabric preferably comprises a drying step in order to reduce the amount of organic solvent after washing, and the organic solvent used for washing preferably has a boiling point of 120° C. or lower, because the amount of the organic solvent can be easily reduced by drying. For drying the organic solvent, a known method such as heat drying or air drying can be used.

When heat drying is performed to reduce the organic solvent, a known method can be used, but from the viewpoint of safety, hot air drying using low-pressure steam or heat medium oil as a heat source is preferable. The drying temperature is preferably equal to or higher than the boiling point of the washing solvent, and is preferably 180° C. or lower from the viewpoint of suppressing deterioration of the silane coupling agent.

The opening filament method of the opening filament step is not particularly limited, and examples thereof include a method of opening the glass fabric with sprayed water (high-pressure water opening), a vibro-washer, ultrasonic water, or mangle. By reducing the tension applied to the glass fabric during this fiber opening process, there is a tendency that the air permeability can be reduced. In order to suppress a reduction in the tensile strength of the glass fabric due to the opening processing, it is preferable to take measures such as reducing the friction of the contact member when weaving the glass yarns, optimizing the sizing agent, and increasing the adhesion amount.

The method for the production of the glass fabric may comprise optional steps after the opening filament step. The optional steps are not particularly limited, and includes, for example, a slitting step.

[Total Carbon Amount of Glass Fabric]

In order to reduce the amount of physically adhering silane coupling agent, which should originally be reduced, while maintaining suitable insulation reliability, the total carbon amount of the glass fabric is preferably 0.02% to 0.5%, more preferably 0.022% to 0.20%, further preferably 0.023% to 0.10%, even further preferably 0.024% to 0.08%, and particularly preferably 0.024% to 0.06%.

[Prepreg]

The prepreg of the present embodiment comprises at least the glass fabric and a matrix resin with which the glass fabric is impregnated. As a result, prepregs having few voids can be provided.

Either of a thermosetting resin or a thermoplastic resin can be used as the matrix resin.

The thermosetting resin is not particularly limited, and examples thereof include:

a) an epoxy resin obtained by adding a compound having an epoxy group and a compound having at least one of an epoxy group-reactive amino group, phenol group, acid anhydride group, hydrazide group, isocyanate group, cyanate group, or hydroxyl group without a catalyst, or with the addition of a catalyst having a reaction catalytic ability such as an imidazole compound, a tertiary amine compound, a urea compound, or a phosphorus compound, and thereafter reacting and curing;

b) a radically polymerizable curable resin obtained by curing a compound having at least one of an allyl group, a methacrylic group, and an acrylic group using a thermal decomposition catalyst or a photodecomposition catalyst as a reaction initiator;

c) a maleimide triazine resin obtained by reacting and curing a compound having a cyanate group and a compound having a maleimide group;

d) a thermosetting polyimide resin obtained by reacting and curing a maleimide compound and an amine compound; and e) a benzoxazine resin obtained by cross-linking and curing a compound having a benzoxazine ring by heat polymerization.

The thermoplastic resin is not particularly limited, and examples thereof include polyphenylene ether, modified polyphenylene ether, polyphenylene sulfide, polysulfone, polyethersulfone, polyarylate, aromatic polyamide, polyetheretherketone, thermoplastic polyimide, insoluble polyimide, polyamideimide, and fluorine resin.

Furthermore, in the present embodiment, a thermosetting resin and a thermoplastic resin may be used together. The prepreg may optionally comprise an inorganic filler. An inorganic filler is preferably used in combination with a thermosetting resin. The inorganic filler may be, for example, aluminum hydroxide, zirconium oxide, calcium carbonate, alumina, mica, aluminum carbonate, magnesium silicate, aluminum silicate, silica, talc, short glass fibers, aluminum borate, or silicon carbide.

[Printed Circuit Board]

The printed circuit board of the present embodiment comprises the prepreg described above. As a result, a printed circuit board having excellent insulation reliability can be provided.

EXAMPLES

Next, the present invention will be described in further detail by means of Examples and Comparative Examples. The present invention is not limited by the following Examples. Various evaluation methods will also be described below.

[Method for Measuring Thickness of Glass Fabric]

In accordance with 7.10 of JIS R 3420, using a micrometer, a spindle is gently rotated and brought into light parallel contact with the measurement surface, and the scale is read after the ratchet sounded three times. JIS R 3420 defines general test methods for glass long fibers and products such as glass fabrics using glass long fibers.

[Method for Measuring Basis Weight (Fabric Weight)]

The basis weight of the fabric is obtained by cutting the fabric to a predetermined size and dividing the weight by the sample area. In these Examples and Comparative Examples, the basis weight of each glass fabric was determined by cutting the glass fabric to a size of 10 cm$^2$ and measuring the weight.

[Converted Thickness]

Since the glass fabric is a discontinuous planar body composed of air and glass, the converted thickness required for measurement by the resonance method is calculated by dividing the basis weight of each glass fabric by the density.

Converted thickness ($\mu$m)=basis weight(g/m$^2$)÷density(g/cm$^3$)

[Dissipation Factor Measurement Method]

The dissipation factor of each glass fabric is measured in accordance with IEC 62562. Specifically, a glass fabric sample having a size required for measurement with each split cylinder resonator is stored in a constant temperature and humidity oven at 23° C. and 50% RH for 8 hours or more to adjust the humidity. Thereafter, the dielectric properties are measured using a split cylinder resonator (manufactured by EM Lab) and an impedance analyzer (manufactured by Agilent Technologies). Measurement is performed five times for each sample, and the average value is obtained. The thickness of each sample is measured using the converted thickness described above. Likewise, a glass plate having a thickness of 300 $\mu$m or less having the same type and composition as each glass fabric raw material is prepared, and the bulk dissipation factor is also measured from the thickness value obtained by measuring the thickness of the glass plate. The methods for measuring dielectric properties in the microwave band of fine ceramic materials for dielectric substrates used mainly in microwave circuits are specified.

[Total Carbon Amount of Glass Fabric]

The surface-treated glass fabric is heated at 800° C. for 1 minute, and the amount of carbon dioxide in the generated gas is measured by gas chromatography to obtain the amount of carbon dioxide in the generated gas. The total carbon amount (%) per unit weight of the glass fabric, including the surface-treated glass fabric, is determined by comparing the amount of carbon dioxide generated when a predetermined amount of acetanilide ($C_8H_9NO$) was similarly heated at 800° C. for 1 minute in advance. A Sumigraph NC-90A (manufactured by Sumika Chemical Analysis Service) is used for measurement.

Molecular weight of acetanilide=135.17

Carbon amount of acetanilide=71.09%

Specifically, the total carbon amount of the glass fabric is calculated based on the following formula.

Total carbon amount of glass fabric=[{weight of acetanilide×(carbon ratio of acetanilide/100})/peak area derived from carbon dioxide generated from acetanilide]×((peak area of carbon dioxide generated from glass fabric/weight of glass fabric)×100)

Example 1

Warp and weft yarns composed of glass fibers having an SiO$_2$ content of more than 99.9 wt % were used. Specifically, as the warp yarns were used silica glass yarns having an average filament diameter of 5.0 $\mu$m, 100 filaments, and a twist number of 1.0 Z, while as the weft yarns were used silica glass yarns having an average filament diameter of 5.0 $\mu$m, 100 filaments, and a twist number of 1.0 Z. Using an air jet loom, a glass fabric was woven at a thread count of 66 warp yarns/25 mm and 68 weft yarns/25 mm. The resulting green fabric was heat-treated at 800° C. for 15 seconds for de-sizing. Next, the glass fabric was immersed in a treatment solution containing 0.9% of 3-methacryloxypropyltrimethoxysilane; Z6030 (manufactured by Dow Toray Industries, Inc.) as a silane coupling agent dispersed in pure water adjusted to pH=3 with acetic acid. After squeezing out the solution, the fabric was heat-dried at 110° C. for 1 minute to fix the silane coupling agent. After washing the dried glass fabric with water followed by drying at 110° C. for 1 minute, the glass fabric was immersed in methanol for finish washing, thereby reducing the denatured products of the silane coupling agent which did not form chemical bonds with the surface of the glass filaments. By drying at 110° C. for 1 minute after finishing washing, a glass fabric A in which the physically adhering modification products of the silane coupling agent were reduced was obtained. After calculating the converted thickness from the basis weight and density of the glass fabric A, the dissipation factor of the glass fabric A was measured. The bulk dissipation factor of the glass was set to 0.00010.

Example 2

A glass fabric B was obtained in the same manner as in Example 1, except that the heat de-oiling treatment was performed at 900° C. for 15 seconds and the heat drying in the drying step was performed at 110° C. for 10 minutes. The dissipation factor of the obtained glass fabric B was measured in the same manner as Example 1.

Example 3

A glass fabric C in which the physically adhering modification products of the silane coupling agent were reduced was obtained in the same manner as in Example 1, except that the heat drying time in the drying step was set to 15 minutes. The dissipation factor of the obtained glass fabric C was measured in the same manner as Example 1.

Example 4

A glass fabric D in which the physically adhering modification products of the silane coupling agent were reduced was obtained in the same manner as in Example 2, except that de-oiling was performed at 360° C. for 48 hours and de-sizing was performed by heating at 1000° C. for 15 seconds. The dissipation factor of the obtained glass fabric D was measured in the same manner as Example 1.

Example 5

Warp and weft yarns were obtained using glass fibers having a composition range of $SiO_2$=40 to 50%, aluminum oxide ($Al_2O_3$)=15 to 25%. $B_2O_3$=25 to 35%, and diphosphorus tetroxide ($P_2O_4$)=5 to 10%. Specifically, as the warp yarns were used silica glass yarns having an average filament diameter of 5.0 μm, 100 filaments, and a twist number of 1.0 Z, while as the weft yarns were used silica glass yarns having an average filament diameter of 5.0 μm, 100 filaments, and a twist number of 1.0 Z. Using an air jet loom, the glass fabric was woven at a thread count of 66 warp yarns/25 mm and 68 weft yarns/25 mm. The resulting green fabric was heat-treated at 660° C. for 1 hour for de-sizing. Next, the glass fabric was immersed in a treatment solution containing 0.9% of 3-methacryloxypropyltrimethoxysilane; Z6030 (manufactured by Dow Toray Industries, Inc.) as a silane coupling agent dispersed in pure water adjusted to pH=3 with acetic acid. After squeezing out the solution, the fabric was heat-dried at 110° C. for 1 minute to fix the silane coupling agent. After washing the dried glass fabric with water followed by drying at 110° C. for 1 minute, the glass fabric was immersed in methanol for finish washing, thereby reducing the denatured products of the silane coupling agent which did not form chemical bonds with the surface of the glass filaments. By drying at 110° C. for 1 minute after finishing washing, a glass fabric E in which the physically adhering modification products of the silane coupling agent were reduced was obtained. The dissipation factor of the obtained glass fabric E was measured by the same method as Example 1. The bulk dissipation factor of the glass was set to 0.0015.

Example 6

A glass fabric F was obtained in the same manner as in Example 1, except that the glass fabric was immersed in a treatment solution in which 0.95% of 5-hexenyltrimethoxysilane; Z6161 (manufactured by Dow Toray Industries, Inc.) as the silane coupling agent was dispersed, and after squeezing out the solution, the fabric was heat-dried at 110° C. for 1 minute to fix the silane coupling agent. After calculating the converted thickness from the basis weight and density of the glass fabric F, the dissipation factor of the glass fabric F was measured.

Example 7

A glass fabric G was obtained in the same manner as in Example 1 except that the glass fabric was immersed in a treatment solution in which 0.85% of 3-acryloxypropyltrimethoxysilane; KBM-5103 (manufactured by Shin-Etsu Silicone) as the silane coupling agent was dispersed, and after squeezing out the solution, the fabric was heat-dried at 110° C. for 1 minute to fix the silane coupling agent. After calculating the converted thickness from the basis weight and density of the glass fabric G, the dissipation factor of the glass fabric G was measured.

Example 8

A glass fabric H was obtained in the same manner as in Example 1 except that the glass fabric was immersed in a treatment solution in which 0.50% of 5-hexenyltrimethoxysilane; Z6161 (manufactured by Dow Toray Industries, Inc.) and 0.45% of 3-methacryloxypropyltrimethoxysilane; Z6030 (manufactured by Dow Toray Industries, Inc.) as the silane coupling agent were dispersed, and after squeezing out the solution, the fabric was heat-dried at 110° C. for 1 minute to fix the silane coupling agent. After calculating the converted thickness from the basis weight and density of the glass fabric H, the dissipation factor of the glass fabric H was measured.

Example 9

A glass fabric I was obtained in the same manner as in Example 1 except that the glass fabric was immersed in a treatment solution in which 0.45% of 3-acryloxypropyltrimethoxysilane; KBM-5103 (manufactured by Shin-Etsu Silicone) and 0.50% of 3-methacryloxypropyltrimethoxysilane; Z6030 (manufactured by Dow Toray Industries, Inc.) as the silane coupling agent were dispersed, and after squeezing out the solution, the fabric was heat-dried at 110° C. for 1 minute to fix the silane coupling agent. After calculating the converted thickness from the basis weight and density of the glass fabric I, the dissipation factor of the glass fabric I was measured.

Comparative Example 1

A glass fabric H was obtained in the same manner as Example 1, except that heat de-oiling was performed at 360°

C. for 48 hours and the finishing washing step and the finishing drying step were not carried out. The dissipation factor of the obtained glass fabric H was measured by the same method as Example 1.

Comparative Example 2

A glass fabric I was obtained in the same manner as Comparative Example 1, except that heat de-oiling was performed at 800° C. for 15 seconds. The dissipation factor of the obtained glass fabric I was measured by the same method as Example 1.

Comparative Example 3

A glass fabric J was obtained in the same manner as in Example 1, except that heat de-oiling was performed at 360° C. for 48 hours. The dissipation factor of the obtained glass fabric J was measured by the same method as Example 1.

[Laminate Production Method]

Regarding the glass fabrics obtained in the Examples and Comparative Examples described above, 45 parts by weight of polyphenylene ether (manufactured by SABIC, SA9000), 10 parts by weight of triallyl isocyanurate, 45 parts by weight of toluene, and 0.6 parts by weight of 1,3-di(tert-butylisopropylbenzene) were added to a stainless-steel vessel and agitated at room temperature for 1 hour to produce a varnish. The glass fabrics were impregnated with the produced varnish and dried at 115° C. for 1 minute to obtain prepregs. Eight sheets of each of the obtained prepregs were stacked, and copper foils having a thickness of 12 μm were further stacked on the top and bottom of these stacks and heated and pressed at 200° C. and 40 kg/cm$^2$ for 120 minutes to obtain a laminate

[Laminate Heat Resistance Evaluation Method]

After removing the copper foils from the laminates obtained as described above, they were heated and absorbed water at 133° C. for 180 hours in a pressure cooker container. The laminates after absorbing water were immersed in a solder bath at 288° C. for 20 seconds, and the presence or absence of blistering due to peeling at the glass fabric/resin interface was visually confirmed (evaluation was carried out four times at each level). In Table 2, the heat resistance was evaluated as:

"A" when there was no swelling in any of the four laminates;

"B" when there was swelling in 1 or 2 laminates; and

"C" when there was swelling in 3 or 4 laminates.

This indicates that glass fabrics having fewer blisters have superior heat resistance.

The production conditions and evaluation results of the Examples and Comparative Examples are shown in Tables 1 and 2.

TABLE 1

|  | Ex 1 | Ex 2 | Ex 3 | Ex 4 | Ex 5 |
|---|---|---|---|---|---|
| Glass fabric No. | A | B | C | D | E |
| Glass composition | $SiO_2$ > 99.9% | $SiO_2$ > 99.9% | $SiO_2$ > 99.9% | $SiO_2$ > 99.9% | $SiO_2$ = 40 to 50% $Al_2O_3$ = 15 to 25% $B_2O_3$ = 25 to 35% $P_2O_4$ = 5 to 10% |
| Heat de-oiling step | 800° C./15 sec | 900° C./15 sec | 800° C./15 sec | 360° C./48 hr | 660° C./1 hr |
| Residual size reduction step | — | — | — | 1000° C./15 sec | — |
| Fixing step | 110° C./1 min | 110° C./1 min | 110° C./1 min | 110° C./1 min | 110° C./1 min |
| Washing step | with water | with water | with water | with water | with water |
| Drying step | 110° C./1 min | 110° C./10 min | 110° C./15 min | 110° C./10 min | 110° C./1 min |
| Finishing washing step | Methanol immersion | Methanol immersion | Methanol immersion | Methanol immersion | Methanol immersion |
| Finishing drying step | 110° C./1 min | 110° C./1 min | 110° C./1 min | 110° C./1 min | 110° C./1 min |
| Total carbon content of glass fabric (%) | 0.06 | 0.25 | 0.47 | 0.22 | 0.15 |
| Dissipation factor of glass fabric @ 10 GHz | 0.00027 | 0.00057 | 0.00097 | 0.00052 | 0.00173 |
| Bulk dissipation factor @ 10 GHz | 0.00010 | 0.00010 | 0.00010 | 0.00010 | 0.00150 |
| \| Dissipation tangent of glass fabric − Bulk dissipation \| @ 10 GHz | 0.00017 | 0.00047 | 0.00087 | 0.00042 | 0.00023 |

TABLE 2

|  | Ex 6 | Ex 7 | Ex 8 | Ex 9 | Comp Ex 1 | Comp Ex 2 | Comp Ex 3 |
|---|---|---|---|---|---|---|---|
| Glass fabric No. | F | G | H | I | H | I | J |
| Glass composition | $SiO_2$ > 99.9% | $SiO_2$ > 99.9% | $SiO_2$ > 99.9% | $SiO_2$ > 99.9% | $SiO_2$ > 99.9% | $SiO_2$ > 99.9% | $SiO$ > 99.9% |
| Heat de-oiling step | 800° C./15 sec | 800° C./15 sec | 800° C./15 sec | 800° C./15 sec | 360° C./48 hr | 800° C./15 sec | 360° C./48 hr |

TABLE 2-continued

|  | Ex 6 | Ex 7 | Ex 8 | Ex 9 | Comp Ex 1 | Comp Ex 2 | Comp Ex 3 |
|---|---|---|---|---|---|---|---|
| Residual size reduction step | — | — | — | — | — | — | — |
| Fixing step | 110° C./ 1 min | 110° C./ 1 min | 110° C./ 1 min | 110° C./ 1 min | 110° C./ 1 min | 110° C./ 1 min | 110° C./ 1 min |
| Washing step | with water | with water | with water | with water | with water | with water | with water |
| Drying step | 110° C./ 1 min | 110° C./ 1 min | 110° C./ 1 min | 110° C./ 1 min | 110° C./ 1 min | 110° C./ 1 min | 110° C./ 1 min |
| Finishing washing step | Methanol immersion | Methanol immersion | Methanol immersion | Methanol immersion | — | — | Methanol immersion |
| Finishing drying step | 110° C./ 1 min | 110° C./ 1 min | 110° C./ 1 min | 110° C./ 1 min | — | — | 110° C./ 1 min |
| Total carbon content of glass fabric (%) | 0.08 | 0.03 | 0.07 | 0.09 | 0.60 | 0.62 | 0.12 |
| Dissipation factor of glass fabric @ 10 GHZ | 0.00030 | 0.00022 | 0.00029 | 0.00032 | 0.00125 | 0.00118 | 0.00160 |
| Bulk dissipation factor @ 10 GHz | 0.00010 | 0.00010 | 0.00010 | 0.00010 | 0.00010 | 0.00010 | 0.00010 |
| \| Dissipation tangent of glass fabric - Bulk dissipation \| @ 10 GHZ | 0.00020 | 0.00012 | 0.00019 | 0.00022 | 0.00115 | 0.00108 | 0.00150 |

The laminate heat resistance evaluation results are shown in Table 3.

TABLE 3

|  | Ex 1 | Ex 2 | Ex 3 | Ex 4 | Ex 5 | Ex 6 | Ex 7 | Ex 8 | Ex 9 | Comp Ex 1 | Comp Ex 2 | Comp Ex 3 |
|---|---|---|---|---|---|---|---|---|---|---|---|---|
| Laminate heat resistance evaluation results | A | A | B | A | A | A | A | A | A | C | C | C |

INDUSTRIAL APPLICABILITY

The glass fabric of the present invention has industrial applicability as a base material for printed circuit boards used in the electronic and electrical fields.

The invention claimed is:

1. A glass fabric comprising glass yarns composed of a plurality of glass filaments and woven as warp and weft yarns, wherein the glass fabric is surface-treatment on a surface thereof with a surface treatment agent, and a difference between a dissipation factor of the glass fabric and a bulk dissipation factor as measured using a split cylinder resonator is greater than 0 and $1.0 \times 10^{-3}$ or less at 10 GHz, and
wherein the bulk dissipation factor of glass constituting the glass yarns is greater than 0 and $2.5 \times 10^{-3}$ or less at 10 GHz.

2. The glass fabric according to claim 1, wherein the difference between the dissipation factor of the glass fabric and the bulk dissipation factor is $8.0 \times 10^{-4}$ or less at 10 GHz.

3. The glass fabric according to claim 1, wherein the glass yarns constituting the glass fabric contain 95 wt % to 100 wt % of silicon (Si) in terms of silicon dioxide ($SiO_2$).

4. The glass fabric according to claim 1, wherein the bulk dissipation factor of glass constituting the glass yarns is greater than 0 and $2.0 \times 10^{-3}$ or less at 10 GHz.

5. The glass fabric according to claim 1, wherein the surface treatment agent comprises a silane coupling agent represented by the following formula (1):

$$X(R)_{3-n}SiY_n \quad (1)$$

where X is an organic functional group having at least one of a radical-reactive unsaturated double bond group and an amino group; each Y is independently an alkoxy group; n is an integer of 1 to 3; and each R is independently a group selected from the group consisting of a methyl group, an ethyl group, and a phenyl group.

6. The glass fabric according to claim 5, where X in formula (1) is an organic functional group that does not form a salt with an ionic compound.

7. The glass fabric according to claim 5, wherein X in formula (1) does not contain an amine or an ammonium cation.

8. The glass fabric according to claim 5, wherein X in formula (1) is an organic functional group having one or more methacryloxy groups or acryloxy groups.

9. The glass fabric according to claim 1, wherein the glass fabric has a total carbon content of 0.02% to 0.5%.

10. The glass fabric according to claim 1, which is for a printed circuit board substrate.

11. A prepreg, comprising the glass fabric according to claim 1, a thermosetting resin, and an inorganic filler.

12. A printed circuit board, comprising the prepreg according to claim 11.

13. The glass fabric according to claim 1, wherein the difference between the dissipation factor of the glass fabric and the bulk dissipation factor is $6.0 \times 10^{-4}$ or less at 10 GHz.

14. The glass fabric according to claim 1, wherein the difference between the dissipation factor of the glass fabric and the bulk dissipation factor is $4.0 \times 10^{-4}$ or less at 10 GHz.

15. The glass fabric according to claim 1, wherein the difference between the dissipation factor of the glass fabric and the bulk dissipation factor is $2.0 \times 10^{-4}$ or less at 10 GHz.

16. The glass fabric according to claim 1, wherein the bulk dissipation factor of the glass constituting the glass yarns is $1.7 \times 10^{-3}$ or less at 10 GHz.

17. The glass fabric according to claim 1, wherein the bulk dissipation factor of the glass constituting the glass yarns is $1.5 \times 10^{-3}$ or less at 10 GHz.

18. The glass fabric according to claim 1, wherein the bulk dissipation factor of the glass constituting the glass yarns is $1.2 \times 10^{-3}$ or less at 10 GHz.

19. The glass fabric according to claim 1, wherein the bulk dissipation factor of the glass constituting the glass yarns is $1.0 \times 10^{-3}$ or less at 10 GHz.

* * * * *